(12) United States Patent
Varnica et al.

(10) Patent No.: US 8,739,009 B1
(45) Date of Patent: May 27, 2014

(54) METHODS AND APPARATUS FOR DEFECT DETECTION AND CORRECTION VIA ITERATIVE DECODING ALGORITHMS

(75) Inventors: Nedeljko Varnica, Sunnyvale, CA (US); Yifei Zhang, Longmont, CO (US); Panu Chaichanavong, Mountain View, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1545 days.

(21) Appl. No.: 12/328,561

(22) Filed: Dec. 4, 2008

Related U.S. Application Data

(60) Provisional application No. 61/017,067, filed on Dec. 27, 2007.

(51) Int. Cl.
*G06F 11/00* (2006.01)

(52) U.S. Cl.
USPC ............ 714/795; 714/794; 714/786; 714/746

(58) Field of Classification Search
USPC ......................................................... 714/795
See application file for complete search history.

(56) References Cited

U.S. PATENT DOCUMENTS

| | | | |
|---|---|---|---|
| 6,029,268 A * | 2/2000 | Kong et al. ................... | 714/795 |
| 6,421,804 B1 | 7/2002 | Lee | |
| 6,924,754 B2 | 8/2005 | Seki | |
| 6,996,170 B2 * | 2/2006 | Thoumy et al. ................ | 375/240 |
| 7,055,090 B2 * | 5/2006 | Kikuchi et al. ................ | 714/801 |
| 7,100,101 B1 | 8/2006 | Hemphill et al. | |
| 7,328,395 B1 | 2/2008 | Burd | |
| 2003/0192002 A1 * | 10/2003 | Sweeney et al. ............... | 714/755 |
| 2004/0199858 A1 * | 10/2004 | Becker et al. ................. | 714/795 |
| 2005/0091568 A1 * | 4/2005 | Levy et al. ..................... | 714/755 |
| 2005/0102597 A1 * | 5/2005 | Martinez et al. .............. | 714/752 |
| 2005/0149836 A1 * | 7/2005 | Tanaka .......................... | 714/794 |
| 2005/0193320 A1 * | 9/2005 | Varnica et al. ................ | 714/800 |
| 2006/0248435 A1 * | 11/2006 | Haratsch ....................... | 714/784 |
| 2007/0192667 A1 * | 8/2007 | Nieto et al. ................... | 714/780 |
| 2008/0008257 A1 * | 1/2008 | Yonesi et al. .................. | 375/262 |
| 2008/0052595 A1 * | 2/2008 | Haratsch et al. .............. | 714/758 |
| 2008/0126908 A1 * | 5/2008 | Lin ................................ | 714/758 |
| 2009/0049358 A1 * | 2/2009 | Jalloul et al. .................. | 714/752 |
| 2009/0150746 A1 | 6/2009 | Chaichanavong et al. | |

OTHER PUBLICATIONS

Chaichanavong et al., "A Tensor-Product parity Code for Magnetic Recording" Citeseer 42(2):350-352 (IEEE), 2006.

\* cited by examiner

*Primary Examiner* — Sarai Butler

(57) ABSTRACT

In iterative decoding, a data recovery scheme corrects for corrupted or defective data by determining reliability metrics for blocks of decoded data. Block or windowed detectors generate block reliability metrics for data blocks (rather than individual bits) of decoded data using soft information from the regular decoding mode or from new iterative decoding iterations performed during error recovery mode. An error recovery system triggers corrective decoding of selected data blocks based on the block reliability metrics, by for example, comparing the block reliability metrics to a threshold or by selecting an adjustable number of the least reliable data blocks.

16 Claims, 10 Drawing Sheets

FIG. 3B

$$H = \begin{pmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 0 & 1 & 0 & 1 & 0 \\ 0 & 1 & 0 & 1 & 0 & 0 & 0 & 0 & 1 \\ 0 & 0 & 1 & 0 & 1 & 0 & 1 & 0 & 0 \end{pmatrix} \begin{matrix} S_1 \\ S_2 \\ S_3 \\ S_4 \\ S_5 \\ S_6 \end{matrix}$$

check nodes $V_1 V_2 V_3 V_4 V_5 V_6 V_7 V_8 V_9$ variable nodes

US 8,739,009 B1

METHODS AND APPARATUS FOR DEFECT DETECTION AND CORRECTION VIA ITERATIVE DECODING ALGORITHMS

CROSS REFERENCE TO RELATED APPLICATION

This claims the benefit of U.S. Provisional Patent Application No. 61/017,067, filed Dec. 27, 2007, which is hereby incorporated by reference herein in its entirety.

BACKGROUND

This invention relates to methods and apparatus for detecting and correcting residual defects in decoded data using iterative decoding.

In many applications, data—e.g., on a communication channel or in the read channel of a data storage device—is encoded using an outer code. Examples of such codes include turbo codes, Low-Density Parity Check (LDPC) codes, and convolutional codes. Encoded data from an outer code are transmitted over a data channel. In that data channel, the signal might become corrupted with noise or defects. On the receiver side, the received signal can be decoded using iterative decoding principles. In channels with memory (or feedback), a feature of iterative decoding is that decoding includes multiple stages (or iterations), each of which includes a detection/equalization block and an outer decoder block. For example, the signal from a detector front end, which may be a finite impulse response (FIR) filter, may be processed by a soft detector—such as a Soft Output Viterbi Algorithm (SOVA) or a Bahl-Cocke-Jelinek-Raviv (BCJR) detector—that operates on branch metrics computed from the FIR signal.

The soft detector provides two outputs—(i) hard decisions for the detected signal and (ii) extrinsic log-likelihood ratios (LLRs), which indicate new reliability information generated by the detector for each of the hard decisions. These LLRs are then passed to the outer decoder for further processing. The outer soft decoder then provides its own hard decisions as well as new extrinsic LLRs. These LLRs from the outer decoder are then passed to the soft detector as a priori LLRs. In the next round of iterative decoding, the soft detector generates new extrinsic LLRs, taking both the a priori LLRs and the FIR signal as inputs. For the first iteration, the a priori LLR inputs to the soft detector are all set to zero. This iterative decoding between soft detector and the outer decoder is carried out until a maximum number of iterations is reached, or a valid code word is found. Iterations may be stopped at the detector or the decoder output. Similar principles apply to memory-less channels (e.g., holographic data storage channels), with the noted exception that iterative decoding in such channels does not include a channel detector.

There are many well-known methods for dealing with channel noise. However, channel defects—i.e., data corruption of a magnitude much greater than noise—must be dealt with differently. In the presence of a channel defect, the FIR signal at the input of the detector is corrupted and thus hard decisions provided by the detector are not reliable and are often in error. A corrupted FIR signal may also cause error propagation to the bits adjacent to the defect location in detector hard decisions, producing "chunk" errors. These errors can further propagate in iterative decoding through unreliable extrinsic LLRs at the defect location. Thus, iterative decoding of channels with defects generally may fail to detect errors at high signal-to-noise ratios (SNR).

It therefore would be desirable to be able to provide more reliable defect detection and recovery for an iteratively-decoded channel.

SUMMARY

The present invention describes several post-processing mechanisms for detecting and correcting defects in decoded data using iterative decoding. When initial decoding of data received from a channel fails to return a valid codeword, an error recovery mode is activated which operates on blocks of the decoded data to detect and correct residual defects in the blocks.

In the detection phase of error recovery, a recovery control unit determines the detection mechanism to be employed, based on the nature of the data and defects in the channel. In one embodiment, in response to determining that the initial decoding phase of the data blocks failed, a detector in an error recovery system determines a degree ($d_j$) of unsatisfied parity checks for each bit ($v_j$) in each data block. The detector calculates a block reliability metric for the data block based at least in part on a sum of the degrees of unsatisfied checks and detects a defect in the data block if the block reliability metric for the block is greater than a threshold. In this embodiment, the degrees of unsatisfied checks may be obtained from one or more iterations from the initial decoding, or from new decoding iterations performed in error recovery mode.

In one embodiment, in response to determining that the initial decoding phase failed, the error recovery system iteratively decodes the data blocks in error recovery mode. From this iterative decoding, a detector receives N signed bit reliability metrics for each bit ($v_j$) in each data block. In this illustrative embodiment, N corresponds to the number of iterations of outer (e.g., LDPC) decoding in the iterative decoding and the bit reliability metrics are a posteriori log-likelihood ratios returned by the outer decoder. The detector determines for each bit ($v_j$) a first sum ($s_j$) of the N signed LLRs for each bit. Using this first sum, the detector calculates a block reliability metric for each data block based at least in part on a second sum ($s_w$), where $s_w$ is an accumulation of all the $s_j$'s for the particular block. In this embodiment, a block is defective if the block reliability metric is less than a threshold.

In one embodiment, in response to determining that the initial decoding phase failed, a detector in the error recovery system receives a priori log-likelihood ratios (LLRs) associated with the bits in each data block in the decoded data. In this illustrative embodiment, the a priori LLRs may be produced from a channel iteration of the initial phase of decoding or from iterative decoding performed in error recovery mode. The detector determines a block reliability metric for each data block based at least in part on a sum of the magnitudes of the a priori LLRs for all bits in the block and detects a defect in the data block if the block reliability metric is less than a threshold.

In one embodiment, in response to determining that the initial decoding phase failed, the error recovery system iteratively decodes the data blocks over at least one channel iteration and N soft decoder iterations, where N is a positive number. A detector in the error recovery system receives for each bit in each of the data blocks at least one a priori log-likelihood ratio (LLR) from the channel iteration, and N extrinsic LLRs from the soft decoder iterations. The decoder selects a subset of the extrinsic LLRs for each bit, each extrinsic LLR being selected for inclusion in the subset if the sign of the extrinsic LLR differs from the sign of the a priori LLR associated with the same bit. Conceptually, this selection excludes from the defect calculations all bit locations for which both the soft decoder and channel iterations produced the same final decision, and focuses defect detection on bit locations in which channel and soft decoder iterations conflicted in outcomes. The detector calculates for each bit ($v_j$) a sum ($s_j$) of the magnitude of extrinsic LLRs in the subset and computes a block reliability metric for each data block in the decoded data based on an accumulation of the sums $s_j$'s. The detector locates a defect in a data block if the block reliability metric is less than a threshold.

For each of the foregoing embodiments, the block size for which a block reliability metric is computed may be optimized based, for example, on the nature of the data and expected error sizes. In some embodiments, the detection window may be a sliding window in which each bit is involved in several detecting equations, a fixed window in which each bit is involved in exactly one detecting equation, or any suitable combination between the two. Furthermore, the selection of the block size involves a tradeoff between false positives and missed detections. The detectors may be used together in error recovery mode. For example, the error recovery system may run a second detector if a first detector fails to return a valid codeword error recovery mode.

In the error correction phase, data blocks that are determined to be defective after detection in error recovery mode are iteratively decoded to correct the defect. In an embodiment, the error recovery system erases LLRs associated with the defective blocks and thereby forces corrective decoding of such blocks. In one embodiment, a set of several candidate codewords for the decoded data may be stored and the most likely codeword selected from the set upon termination of the error recovery process.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3B is an illustrative determination of degrees of unsatisfied parity checks for bit nodes;

DETAILED DESCRIPTION

The present invention describes several post-processing mechanisms for detecting and correcting defects in decoded data using iterative decoding. In embodiments described below, when initial decoding of data received from a channel fails to return a valid codeword, an error recovery mode is initiated which operates on blocks of the decoded data to detect and correct residual defects in the blocks. The post-processing mechanisms described herein rely on iterative decoding principles, and may be implemented in hardware, firmware, or any suitable combination thereof.

Figure 1:
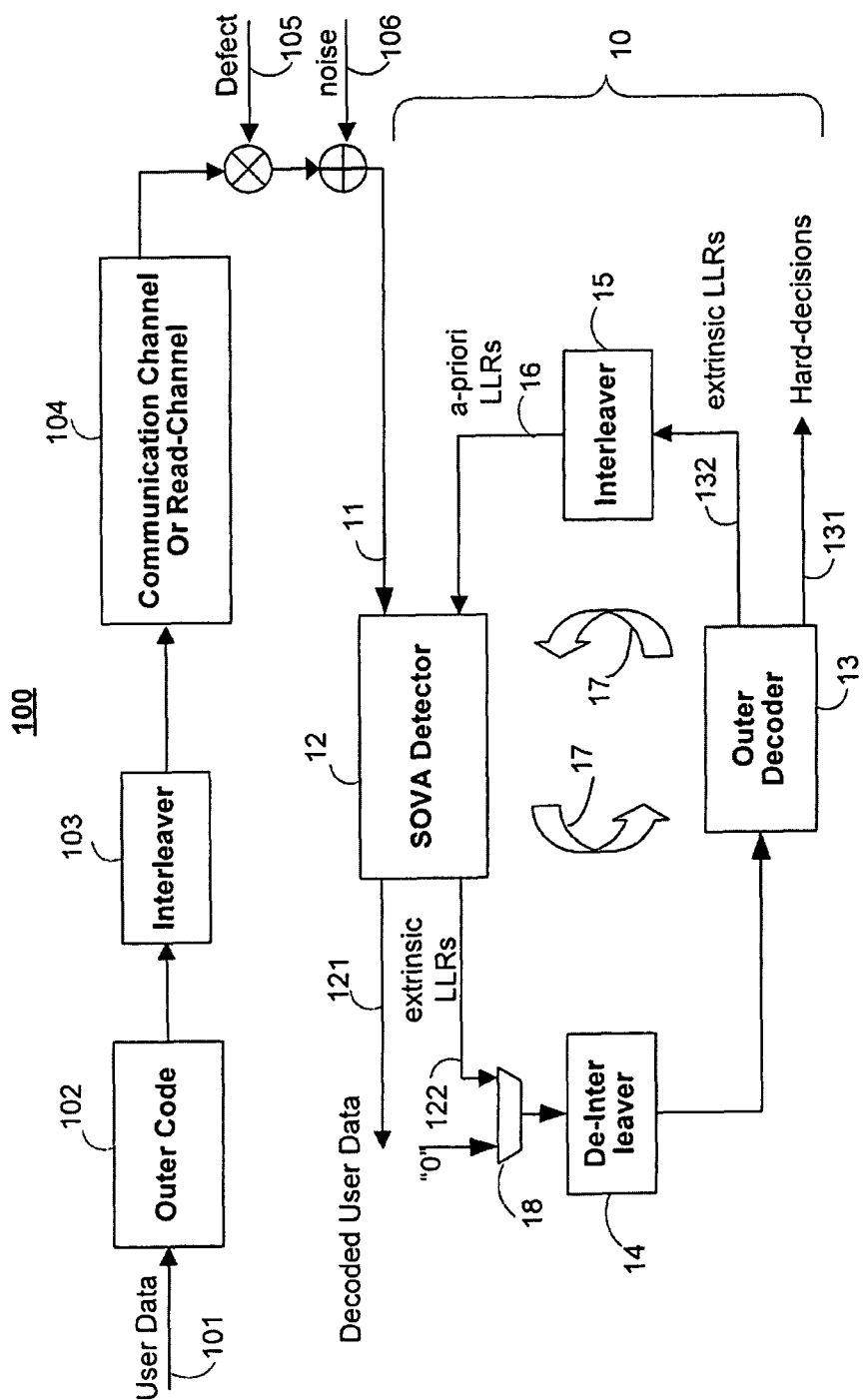
FIG. 1 is a schematic view of an iteratively-decoded data channel in accordance with an embodiment of the invention.

FIG. 1 illustrates a data channel 100 which includes an iterative decoder portion 10. User data are input at 101. The input data are encoded using an outer code 102, such as a turbo code, an LDPC code or a convolutional code. For simplicity, and without limiting the invention as such, it will be assumed that outer code 102 is an LDPC code. An LDPC code, C, is specified in terms of low-density (sparse) N-by-K binary parity check matrix H, where N is the length of a codeword in C and K is a user data size. A binary string c is a codeword in C if and only if H·c=0. The present invention applies to all types of LDPC codes. This includes both regular LDPC codes, regardless whether they are structured or random-like. In some embodiments, the encoded data may be interleaved at 103, and then communicated or read in channel 104, where defects 105 and noise 106 may be introduced. Decoder portion 10 is an illustrative iteratively-decoded channel. Equalized data from the detector front end (e.g., a FIR filter; not shown) are input at 11. Decoder portion 10 in this example includes a soft decoder 12. In this example, soft decoder 12 includes a SOVA detector, which produces non-return-to-zero (NRZ) output 121, and LLR output 122. However, any suitable soft decoder, such as a BCJR decoder, may be used. Decoder portion 10 also includes an outer decoder 13 (e.g., an LDPC decoder, a turbo decoder, or a convolutional decoder).

During iterative decoding, LLR output 122 of detector 12 may pass through de-interleaver 14 before serving as input to outer decoder 13. Outer decoder 13 provides hard decisions 131 and LLR output 132. LLR output 132 may pass through interleaver 15 which provides de-interleaved LLRs as a priori LLR inputs 16 to detector 12. As indicated by arrows 17, detector 12 and outer decoder 13 are used iteratively—e.g., there may be three iterations—and detector output 121 may be used as the decoded output—i.e., detector 12 may be the last stage in the iterative decoding process. When corrupt or defective data are detected, LLRs at the defective bit locations are set to zero—e.g., using multiplexer 18 to select a "0" instead of the extrinsic LLR from detector 12 so that there is no contribution to the input of the outer decoder from the defective data.

Figure 2:
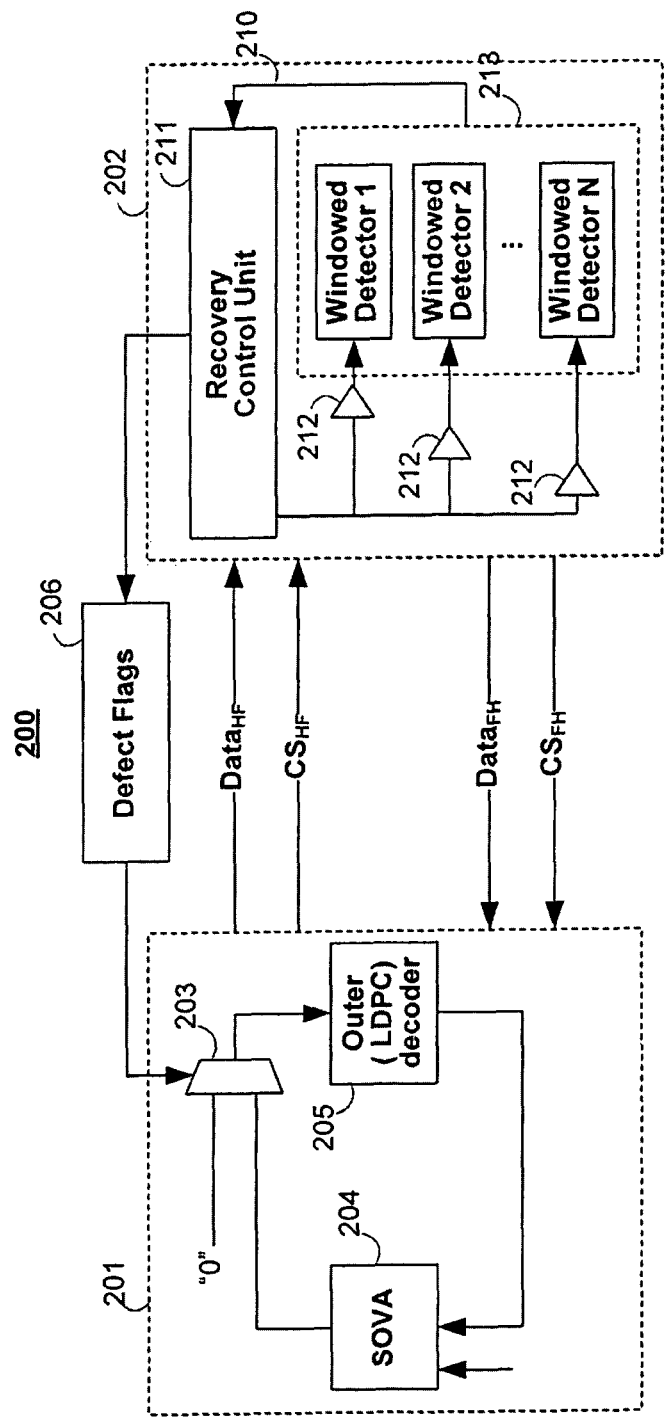
FIG. 2 is a schematic view of an error recovery system 200 according to an embodiment of the invention.

In accordance with embodiments of the present invention, if iterative decoder portion 10 fails to return a codeword after decoding, the decoded data or related soft information may be further processed by an error recovery system which detects and corrects residual defects that remain after iterative decoder portion 10 has returned a final decoding decision. Accordingly, FIG. 2 illustrates error recovery system 200 according to an embodiment of the invention. System 200 includes an iterative decoder portion 201 and a post-processing unit (PPU) 202. Generally speaking, error recovery system 200 is initiated if decoder portion 10 of FIG. 1 fails to return a codeword in regular decoding mode. Iterative decoder portion 201 in error recovery mode resembles decoder portion 10 (FIG. 1) and may be the same circuitry as decoder portion 10. In this illustrative embodiment, iterative decoder portion 201 includes SOVA detector 204 and LDPC decoder 205. The number of channel iterations and LDPC iterations in iterative decoder portion 201 may be different from the number of iterations in iterative decoder portion 10.

For example, iterative decoder 601 may perform one channel (SOVA) iteration followed by three LDPC iterations when it operates on decoded data in error recovery mode—e.g., the number of SOVA and LDPC iterations may be controlled by post-processing unit (PPU) 202. In error recovery mode, PPU 202 receives signal $CS_{HF}$ indicating that iterative decoder portion 10 of FIG. 1 finished decoding data that it received from channel 104 (FIG. 1). In some embodiments, PPU 202 also receives information regarding whether this decoding failed or succeeded (e.g., through $DATA_{HF}$ line), and in some cases, also receives information about the type of failure, e.g., near-codeword type failure, non-near-codeword type failure, the syndrome weight of the LDPC failure, etc.

Based on decoding information received by PPU 202, recovery control unit (RCU) 211 selects, using selectors 212, which one of the post-processing "windowed" detectors 213 to apply. Illustrative embodiments of windowed detectors 213 are described below with reference to FIGS. 3A-6. As described below, windowed detectors 213 generate block reliability metrics for blocks (rather than individual bits) of decoded data using soft information from the regular decoding mode or from new iterative decoding iterations triggered by PPU 202. In embodiments where windowed detectors 213 rely on soft information from new iterations, PPU 202 may send information about the number of channel (SOVA) and LDPC iterations to be run, as well as decoding statistics to be collected from such iterations, to iterative decoder portion 201 through $DATA_{FH}$ and/or $CS_{FH}$. As described below with reference to FIGS. 3A-6, the statistics collected and, in some cases, the number of iterations in error recovery mode, may depend on the type of windowed detector 213. Using the collected decoding statistics, selected windowed detector 213 determines block reliability metrics 210 indicating the reliability of each block of decoded data. Thus, unlike the soft information received from iterative decoder 201, which relates to the reliability of each decoded bit, block reliability metrics 210 returned by windowed detectors 213 are related to the reliability of block of decoded data as a whole. This produces a more reliable detection result for channels with defects because at high noise amplitudes, residual (undetected) defects typically occur in "chunks" which are difficult to detect in isolated bits.

Based on the output of the selected windowed detector 213, RCU 211 provides defect flags 206. The defect flag 206 for a block is set if the block is indicated to be defective by selected windowed detector 213. For each block having an active defect flag, the LLRs corresponding to bit locations in the block is erased, and the sector is redetected/re-decoded in the next channel iteration. In the illustrative example of system 200, defect flags 206 control multiplexer 203, which determines the LLR inputs for outer decoder 205 during error recovery. When a defect flag for a bit location is set, multiplexer 203 selects a "0" instead of the SOVA extrinsic LLR for that bit location, thereby causing the detector/decoder to ignore contributions from prior iterations and redetect/re-decode that position in the next iteration.

Figure 3A:
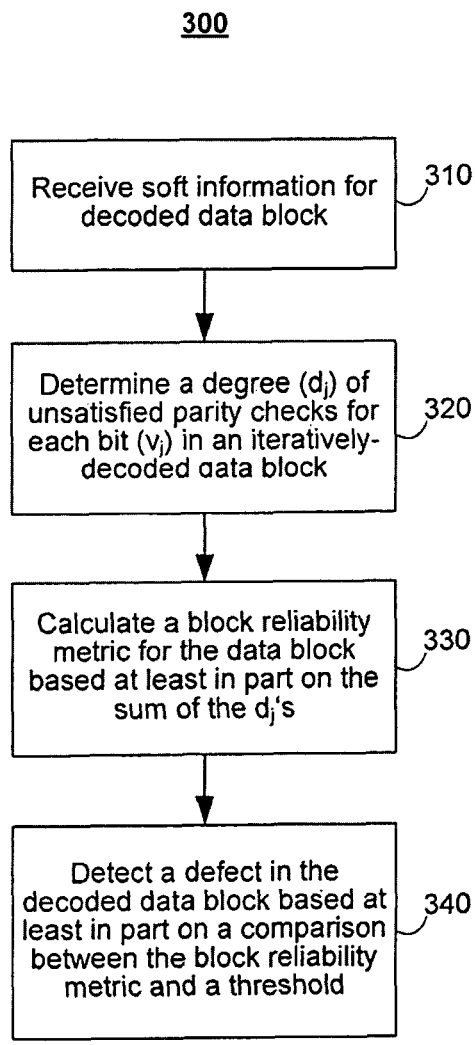
FIG. 3A illustrates process 300 that may be implement by a block detector employed by post-processing unit 202 (FIG. 2) in accordance with an embodiment of the invention.

FIG. 3A illustrates process 300 that may be implemented by a block (or "windowed") detector employed by post-processing unit 202 (FIG. 2) in accordance with an embodiment of the invention. Generally speaking, process 300 detects defects in a decoded data block of size w by comparing the average degree of unsatisfied parity checks per bit for the data block with a threshold. Thus, process 300 detects a defect in a data block if:

$$\left(\frac{1}{w}\sum_{j=i}^{i+w} d_{SUC}^{(n)}(v_j)\right) > T \qquad (1)$$

where:
- w is a block or window size typically determined by PPU 202 (FIG. 2);
- $v_j$ is the bit at node j in the block;
- $d_{SUC}^{(n)}$ is the degree of the set of unsatisfied parity checks in the $n^{th}$ outer decoder (e.g., LDPC) iterations of iterative decoding in error recovery mode; and
- T is a reliability threshold determined by PPU 202 (FIG. 2).

The degree d may be the cumulative degree of unsatisfied checks in all n iterations combined, or it may be the degree of unsatisfied checks for the final iteration. Equation (1) is merely illustrative of process 300. In an embodiment that implements the detector of equation (1), at step 310, soft information associated with decoded bits in the decoded block is received. At step 320, the degree of unsatisfied parity checks ($d_j$) for each bit node in the decoded block is determined. As used herein, a bit node has an unsatisfied parity check if a parity check constraint on the bit based on the parity check matrix H fails. Thus, referring to the example in FIG. 3B, each of nodes $V_1$ to $V_9$ is associated with one or more of six parity check equations represented by $S_1$ through $S_6$. For example, bit node $V_1$ is associated with two parity check equations, $S_1$ and $S_5$, each of which may be unsatisfied. For instance, if both $S_1$ and $S_4$ are unsatisfied, then the degree $d_1$ is equal to 2.

The process continues to step 330 where a block reliability metric for the decoded block is determined, based at least in part on the sum of $d_j$'s. In some embodiments, the sum of degrees of unsatisfied parity checks may be normalized by the number of bits in the block to obtain an average degree of unsatisfied checks per bit. However, this normalization is not required. The process continues to step 340 where a defect is detected in the data block based on a comparison between the block reliability metric and a threshold T. In some embodiments, the defect is detected if the block reliability metric is greater than T. Process 300 may be performed by hardware, firmware, or any suitable combination thereof. For example, for small defect sizes, process 300 may be implemented by firmware which receives unprocessed information regarding unsatisfied checks from hardware. However, for large defect sizes, the detection may be performed entirely by hardware, which then communicates defects to firmware for correction. It is understood that process 300 is merely illustrative, and that some steps may be omitted, reversed, or performed simultaneously without departing from the principles of the invention.

Figure 4:
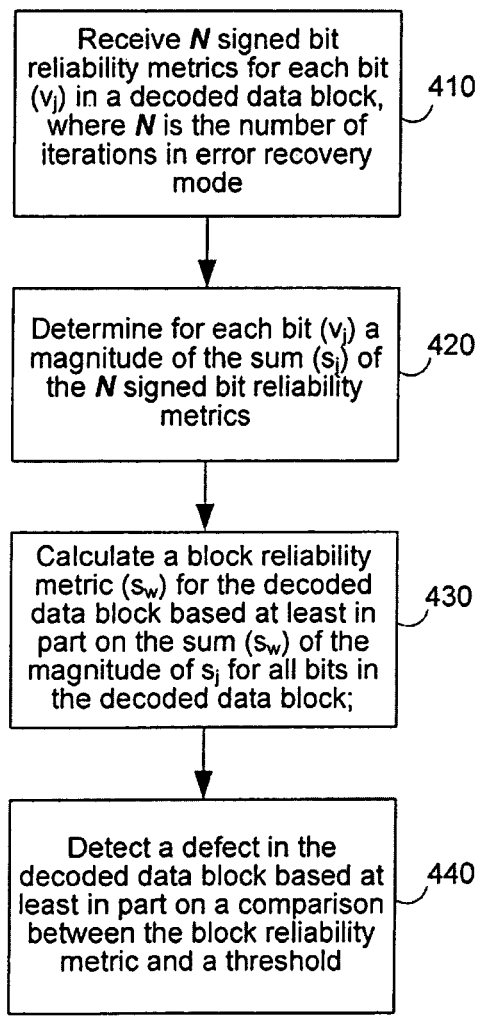
FIGS. 4-6 illustrate processes 400, 500, and 600, respectively that may be implemented by a detector employed by error recovery system 200 (FIG. 2) in accordance with embodiments of the invention.

FIG. 4 illustrates process 400 that may be implemented by a block (or "windowed") detector employed by post-processing unit 202 (FIG. 2) in accordance with an embodiment of the invention. Generally speaking, process 400 detects defects in an iteratively-decoded data block of size w by comparing the average a posteriori LLR per bit within the block to a threshold. Thus, process 400 detects a defect in a data block if:

$$\left(\frac{1}{wN}\sum_{j=i}^{i+w}\left|\sum_{n=1}^{N} L_{app(j)}^{(n)}\right|\right) < T \qquad (2)$$

where:
  w is the block/window size;
  N is the total number of LDPC iterations in error recovery mode;
  $L_{app(j)}^{(n)}$ is the a posteriori LLR at node j in the $n^{th}$ iteration of iterative decoding in error recovery mode; and
  T is a reliability threshold determined by post-processing unit 202 (FIG. 2).

It is understood that equation (2) is merely illustrative of process 400. In an embodiment that implements the detector of equation (2), at step 410, soft information associated with decoded bits in the block is received. For example, referring to error recovery system 200 of FIG. 2, PPU 202 may instruct iterative decoder portion 201 (FIG. 2) to run one SOVA iteration followed by N LDPC iterations if decoding in the regular regime fails to produce a codeword. In this illustrative embodiment, the received soft information includes N signed extrinsic LLR outputs of the N LDPC iterations for each bit ($v_j$) in the decoded block. For example, in an embodiment with window size W=10 and N=3, process 400 may receive 10×3 extrinsic LLR values per block of data. In this embodiment, additional memory may be used to store the accumulated LLRs over the several LDPC iterations. The received soft information also includes an a priori LLR output for each bit, resulting from the one SOVA iteration. Process 400 relies on an a posteriori LLR for each bit over the several LDPC iterations. As used herein, the a posteriori LLR for a bit in the $n^{th}$ iteration of decoding refers to the sum of the a priori (SOVA) LLR for the bit and the extrinsic (LDPC) LLR for the bit during that iteration.

The process continues at step 420 where the N a posteriori LLR values for each bit are added to obtain a sum $s_j$. Generally, the smaller the magnitude of $s_j$ for a particular bit, the higher the likelihood of defect in that location. At step 430, the magnitudes ($|s_j|$) of all $s_j$'s in the window are added and a block reliability metric is determined for the window based at least in part on the sum of $|s_j|$'s. In some embodiments, the sum of $|s_j|$'s may be normalized by the product of the block or window size and the number of iterations to obtain an average magnitude of a posteriori LLR per bit. However, this normalization is not required. The process continues at step 440 where a defect is detected in the data block based on a comparison between the block reliability metric and a threshold T. In some embodiments, the defect is detected if the block reliability metric is less than T. Process 400 may be performed by hardware of firmware. It is understood that process 400 is merely illustrative, and that some steps may be omitted, reversed, or performed simultaneously without departing from the principles of the invention.

Figure 5:
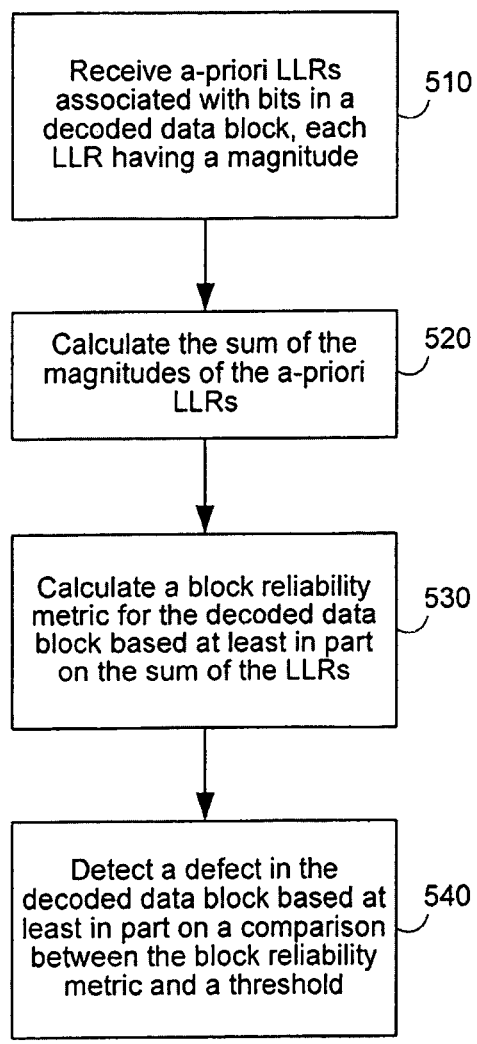

FIG. 5 illustrates process 500 that may be employed by a block (or "windowed") detector employed by post-processing unit 202 (FIG. 2) in accordance with an embodiment of the invention. Generally speaking, process 500 detects defects in an iteratively-decoded data block of size w by comparing the average magnitude of the a priori LLR per bit within the block to a threshold. Thus, process 500 detects a defect in a data block if:

$$\left(\frac{1}{w}\sum_{j=i}^{i+w}|La_j|\right) < T \quad (3)$$

where:
  w is the block or window size;
  $La_j$ is the a priori (channel) LLR at node j; and T is a reliability threshold determined by the post-processing unit.

Equation (3) is merely illustrative of process 500. In an embodiment that implements the detector of equation (3), at step 510, soft information associated with decoded bits in the block is received. In this illustrative embodiment, the soft information includes the a priori LLR values generated by a channel (SOVA) iteration for the bits in the block. Referring to FIG. 2, the SOVA iteration may be performed in error recovery mode by iterative decoder portion 201 or it may be selected from the decoding iterations (e.g., the final channel iteration performed by decoder 10) in the regular decoding mode. At step 520, a sum $s_w$ of the magnitudes of the a priori LLRs is calculated. The process continues at step 530 where a block reliability metric for the decoded data block is computed based at least in part on the sum $s_w$. In some embodiments, the sum $s_w$ may be normalized by the block or window size to obtain an average magnitude of a priori LLR per bit in the block. However, this normalization is not required. The process continues at step 540 where a defect is detected in the data block based on a comparison between the block reliability metric and a threshold T. In some embodiments, the defect is detected if the block reliability metric is less than T. Process 509 may be performed by hardware or firmware. It is understood that process 500 is merely illustrative, and that some steps may be omitted, reversed, or performed simultaneously without departing from the principles of the invention.

Figure 6:
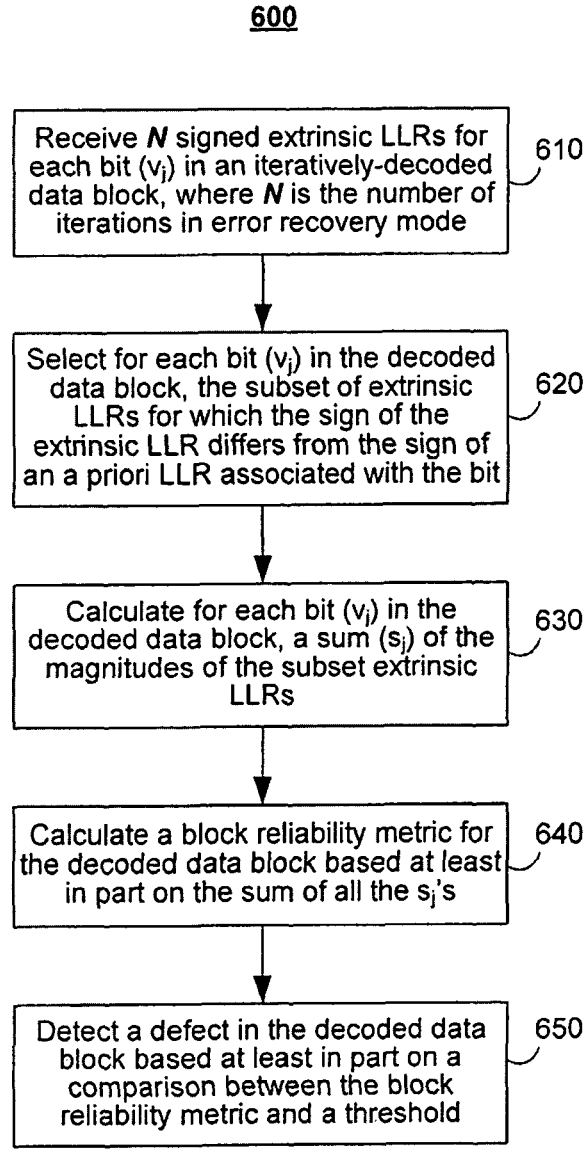

FIG. 6 illustrates process 600 that may be employed by a block (or "windowed") detector employed by a post-processing unit in accordance with an embodiment of the present invention. In an embodiment, process 600 detects a defect in a data block if:

$$\left(\frac{1}{wN}\sum_{n=1}^{N}\sum_{j=i}^{i+w}|Le_j^{(n)}|\right) < T \quad (4)$$

$$La_j \cdot Le_j^{(n)} < 0$$

where:
  w is the block or window size;
  N the total number of LDPC iterations in error recovery mode;
  $Le_j^{(n)}$ is the extrinsic (LDPC) LLR at node j in the $n^{th}$ iteration of iterative decoding in error recovery mode;
  $La_j$ is the a priori (channel) LLR at node j; and
  T is a reliability threshold determined by post-processing unit 202 (FIG. 2).

Equation (4) is merely illustrative of detection process 600. In an embodiment that implements the detector of equation (4), at step 610 of process 600, soft information associated with decoded bits in the decoded block is received. In this illustrative embodiment, the received soft information includes, for each bit ($v_j$) in the decoded block, N signed extrinsic LLRs generated respectively by N LDPC decoding iterations in error recovery mode. At step 620, a subset of the N extrinsic LLRs for each bit ($v_j$) in the decoded data block, is selected. The selected subset of extrinsic LLRs includes only those extrinsic LLR outputs from the LDPC iterations for which the sign of the extrinsic LLR differs from the sign of an a priori (channel) LLR associated with the same bit. Conceptually, process 600 excludes from the defect calculations all bit locations for which both the LDPC and SOVA iterations produced the same final decision, and focuses defect detection on bit locations in which SOVA and LDPC conflicted in outcomes. At step 630, the magnitudes of the selected LLRs for each bit are added to obtain a sum $s_j$ for each bit. At step 640, the $s_j$'s for all bits in the block are added to obtain a sum $s_w$ for the block, and a block reliability metric for the decoded data block is computed based at least in part on this composite sum $s_w$. In some embodiments, $s_w$ may be normalized by the product of the block size and N to derive the block reliability metric. However, this normalization is not required. The process continues at step 650 where a defect is detected in the data block based on a comparison between the block reliability metric and a threshold T. In some embodiments, the defect is detected if the block reliability metric is less than T. Process 600 may be performed by hardware of firmware. It is understood that process 600 is merely illustrative, and that some steps may be omitted, reversed, or performed simultaneously without departing from the principles of the invention.

For each of processes 300 (FIG. 3), 400 (FIG. 4), 500 (FIG. 5), and 600 (FIG. 6), the block size w may be optimized based on the nature of the data and expected error sizes. For example, detection window may be a sliding window in which each bit is involved in w detecting equations, a fixed window in which each bit is involved in exactly one detecting equation, or any suitable combination between the two. Furthermore, the selection of window size involves a tradeoff between false positives and missed detections Though not shown explicitly, it will be understood that detectors implementing processes 300 (FIG. 3), 400 (FIG. 4), 500 (FIG. 5), and 600 (FIG. 6) may be used together in error recovery mode. For example, PPU 202 may select a detector that implements process 400 if a detector that implements process 300 fails to return a valid codeword in error recovery mode.

Figure 7:
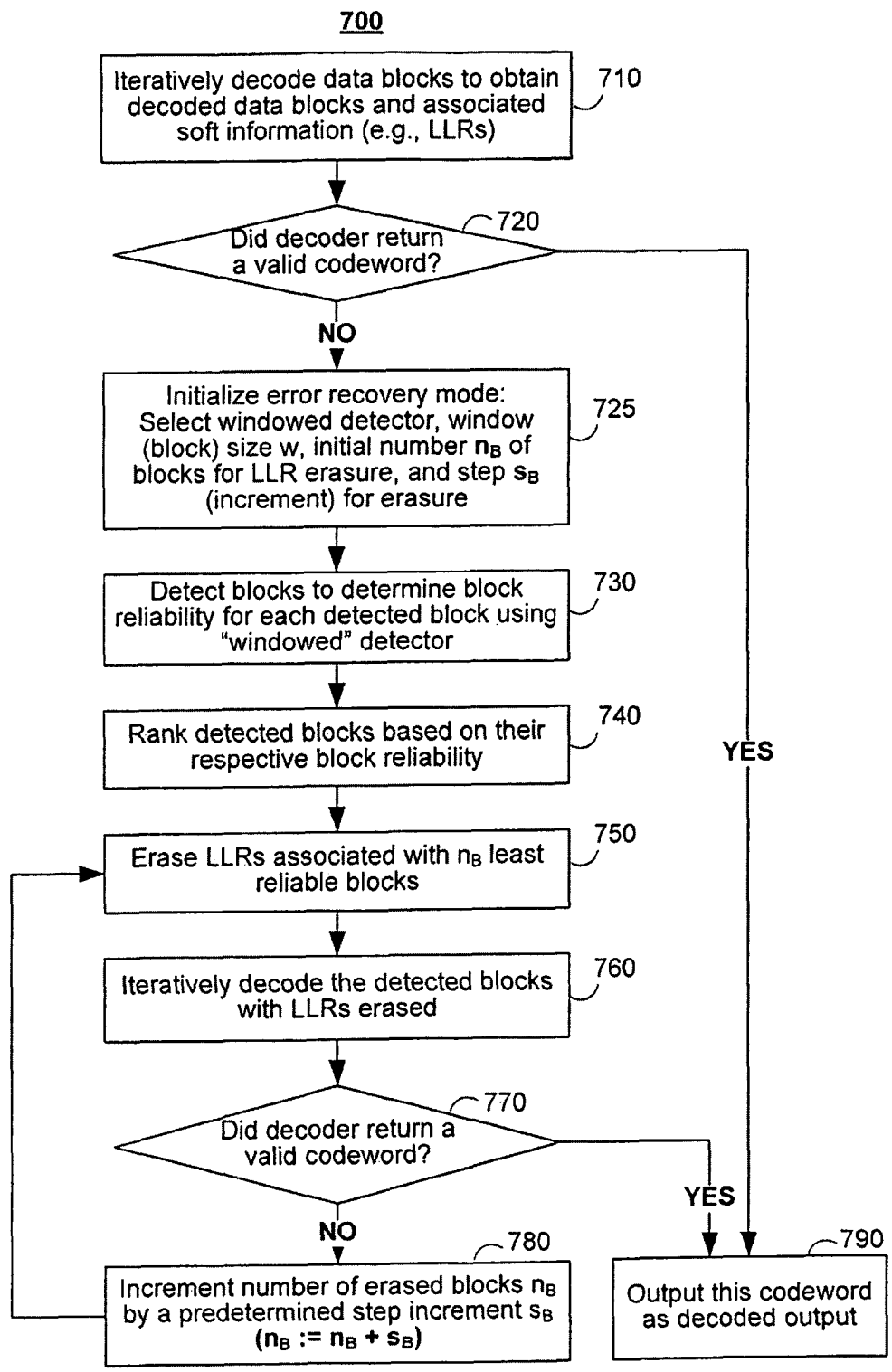
FIG. 7 describes ranking method 700 for detecting and correcting residual defects in decoded blocks in accordance with an embodiment of the invention.

FIG. 7 describes ranking method 700 for detecting and correcting residual defects in decoded blocks in accordance with an embodiment of the invention. At step 710, data received from channel 104 (FIG. 1) are decoded by decoder portion 10 (FIG. 1) to obtain decoded data and associated soft information. At step 720, a determination is made whether decoding by decoder portion 10 (FIG. 1) returned a valid codeword. In response to determining that decoding at step 710 returned a codeword, the codeword is returned as the decoded output at step 790 and error recovery mode is not invoked. Otherwise, error recovery mode is initiated at step 725. In an embodiment, PPU 202 (FIG. 2) determines a window or block size w, an initial number $n_B$ of defective blocks to be erased, and a step increment $s_B$ that determines an adjustment to $n_B$ during defect correction during error recovery. At step 725, recovery control unit 211 (FIG. 2) of system 200 selects a windowed detector 213 to detect defects in data blocks in the decoded data. Selected windowed detector 213 may be a detector that implements any of processes 300 (FIG. 3), 400 (FIG. 4), 500 (FIG. 5), and 600 (FIG. 6).

The process continues at step 730 where the selected window detector determines a block reliability metric for each block in the decoded data. At step 740, the data blocks are ranked based on their respective block reliability metric determined at step 730. At step 750, $n_B$ least reliable data blocks are selected and their associated LLRs are erased, for example, by setting the appropriate defect flags 206 (FIG. 2). The process continues at step 760 where blocks having erased LLRs are iteratively decoded. In some embodiments, PPU 202 (FIG. 2) may determine the number of iterations to be performed in this corrective iterative decoding. At step 770, a determination is made whether corrective decoding at step 760 returned a valid codeword. In response to determining that decoding at step 760 returned a codeword, the codeword is returned as the decoded output at step 790. Otherwise, the process continues at step 780, where the number of erased blocks $n_B$ is increased by $s_B$. The process returns to step 750 to erase the additional blocks. Process 700 may be performed by hardware of firmware. It is understood that process 700 is merely illustrative, and that some steps may be omitted, reversed, or performed simultaneously without departing from the principles of the invention.

Figure 8:
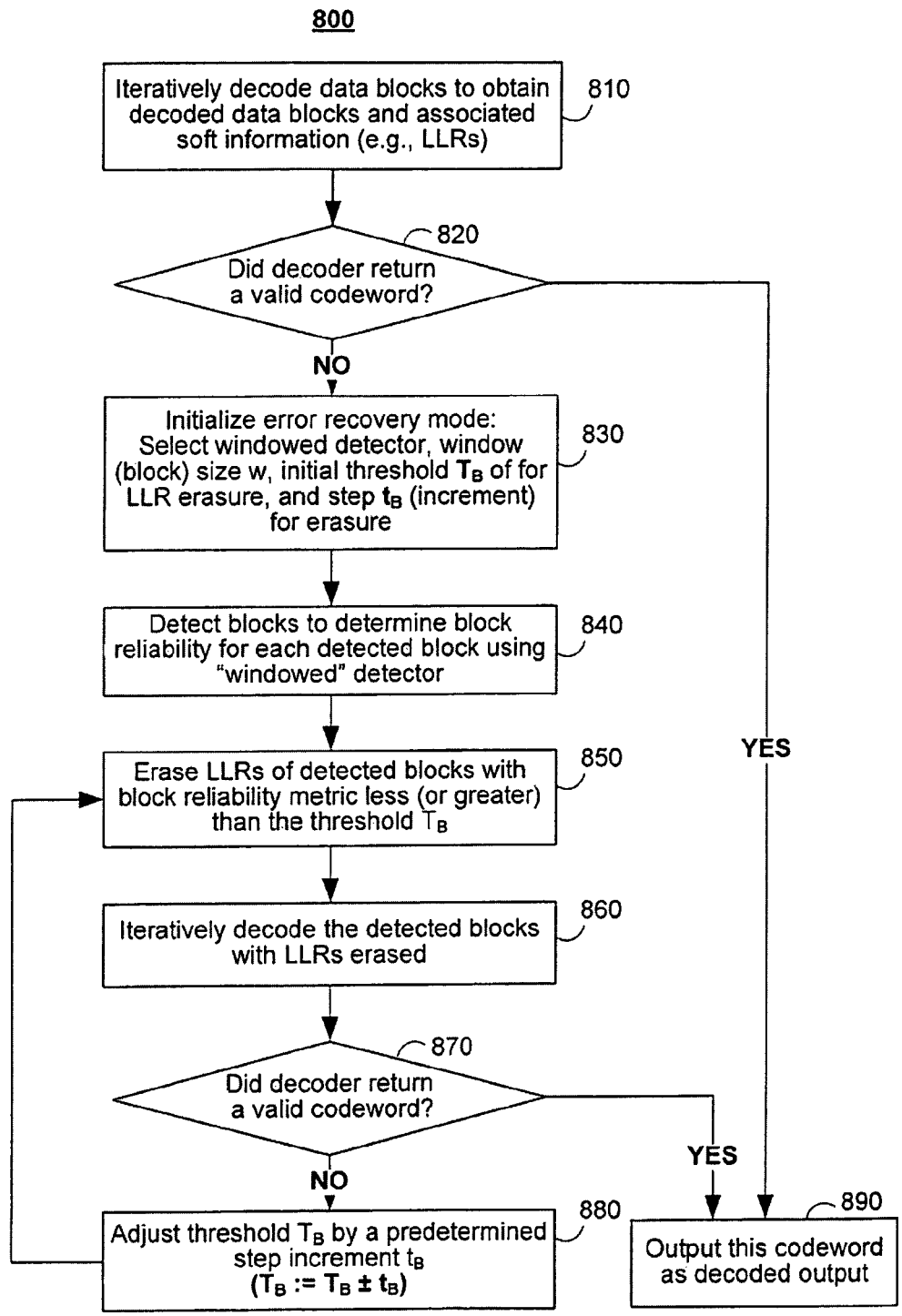
FIG. 8 describes threshold method 800 for detecting and correcting residual defects in decoded blocks according to an embodiment of the invention.

FIG. 8 describes threshold method 800 for detecting and correcting residual defects in decoded blocks according to an embodiment of the invention. At step 810, data received from channel 104 (FIG. 1) are decoded by decoder portion 10 (FIG. 1) to obtain decoded data and associated soft information. At step 820, a determination is made whether decoding by decoder portion 10 (FIG. 1) returned a valid codeword. In response to determining that decoding at step 810 returned a codeword, the codeword is returned as the decoded output at step 890 and error recovery mode is not invoked. Otherwise, error recovery mode is initiated at step 830. In an embodiment, PPU 202 (FIG. 2) determines a window or block size w, an initial threshold $T_B$ for selecting defective blocks to be erased, and a step increment $t_B$ that determines an adjustment to $T_B$ during defect correction during error recovery. At step 830, recovery control unit 211 (FIG. 2) of system 200 may select a windowed detector 213 (FIG. 2) to detect defects in data blocks in the decoded data. Selected windowed detector 213 (FIG. 2) may be a detector that implements any one of processes 300 (FIG. 3), 400 (FIG. 4), 500 (FIG. 5), and 600 (FIG. 6).

The process continues at step 840 where the selected window detector determines a block reliability metric for each block in the decoded data. At step 850, data blocks having a reliability metric that fails a constraint on $T_B$ are selected and their associated LLRs are erased, for example, by setting the appropriate defect flags 206 (FIG. 2). For process 300 (FIG. 3), the LLRs for a data block are selected for erasure if its associated block reliability metric (which is determined based on the number of unsatisfied parity checks) is greater than $T_B$. For a detector that implements process 400 (FIG. 4), 500 (FIG. 5), or 600 (FIG. 6), the LLRs for a data block are selected for erasure if the associated block reliability metric is less than $T_B$. The process continues at step 860 where blocks having erased LLRs are iteratively decoded. In some embodiments, PPU 202 (FIG. 2) may determine the number of iterations to be performed in this corrective iterative decoding. At step 870, a determination is made whether corrective decoding at step 860 returned a valid codeword. In response to determining that decoding at step 860 returned a codeword, the codeword is returned as the decoded output at step 890. Otherwise, the process continues at step 880, where the threshold $T_B$ is adjusted by $t_B$. For process 300 (FIG. 1), the $T_B$ is decreased by $t_B$. For a detector that implements process 400 (FIG. 4), 500 (FIG. 5), or 600 (FIG. 6), $T_B$ is increased at step 880. The process returns to step 850 to erase the additional blocks that fail the constraint on $T_B$. Process 800 may be performed by hardware of firmware. It is understood that process 800 is merely illustrative, and that some steps may be omitted, reversed, or performed simultaneously without departing from the principles of the invention.

Figure 9:
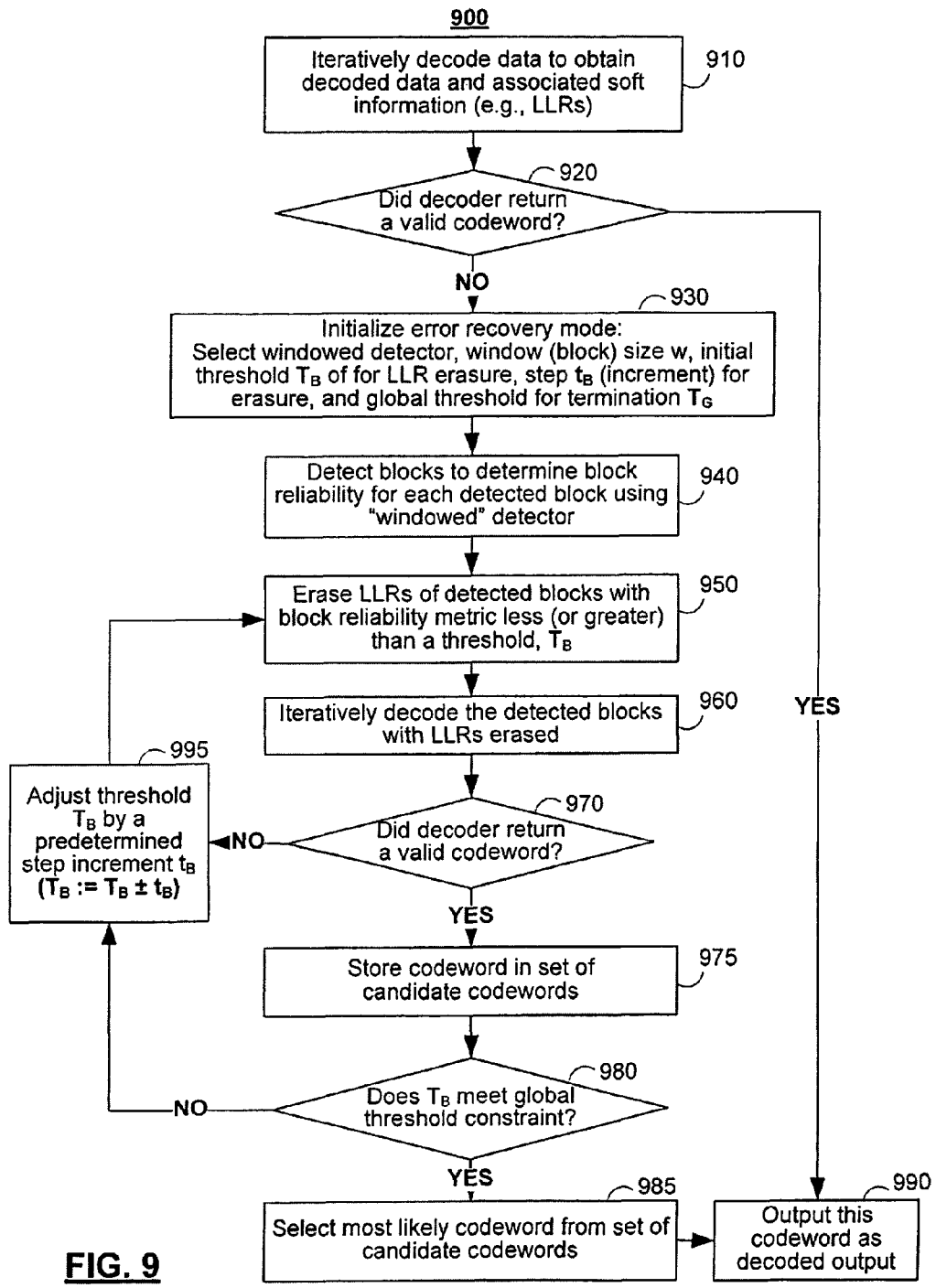
FIG. 9 describes threshold method 900 for detecting and correcting residual defects in decoded blocks which selects a final codeword from a set of candidate codewords in accordance with an embodiment of the invention.

FIG. 9 describes threshold method 900 for detecting and correcting residual defects in decoded blocks which selects a final codeword from a set of candidate codewords in accordance with an embodiment of the invention. At step 910, data received from channel 104 (FIG. 1) are decoded by decoder portion 10 (FIG. 1) to obtain decoded data and associated soft information. At step 920, a determination is made whether decoding by decoder portion 10 (FIG. 1) at step 910 returned a valid codeword. In response to determining that decoding at step 910 returned a codeword, the codeword is returned as the decoded output at step 990 and error recovery mode is not invoked. Otherwise, error recovery mode is initiated at step 930. In an embodiment, PPU 202 (FIG. 2) determines a window or block size w, an initial threshold $T_B$ for selecting defective blocks to be erased, a step increment $t_B$ that determines an adjustment to $T_B$ during defect correction during error recovery, and a global threshold $T_G$ that determines the termination condition for process 900. At step 930, recovery control unit (RCU) 211 (FIG. 2) of system 200 may select a windowed detector 213 (FIG. 2) to detect defects in data blocks in the decoded data. Selected windowed detector 213 (FIG. 2) may be a detector that implements any of processes 300 (FIG. 3), 400 (FIG. 4), 500 (FIG. 5), or 600 (FIG. 6).

The process continues at step 940 where the selected window detector determines a block reliability metric for each block in the decoded data. At step 950, data blocks having a reliability metric that fails a constraint on $T_B$ are selected and their associated LLRs are erased, for example, by setting the appropriate defect flags 206 (FIG. 2). For process 300 (FIG. 3), the LLRs for a data block are selected for erasure if its associated block reliability metric (which is determined based on the number of unsatisfied parity checks) is greater than $T_B$. For a detector that implements any of processes 400 (FIG. 4), 500 (FIG. 5), or 600 (FIG. 6), the LLRs for a data block are selected for erasure if the associated block reliability metric is less than $T_B$. The process continues at step 960 where blocks having erased LLRs are iteratively decoded. In some embodiments, PPU 202 (FIG. 2) may determine the number of iterations to be performed in this corrective iterative decoding. At step 970, a determination is made whether corrective decoding at step 960 returned a valid codeword. If corrective decoding at step 960 failed to return a codeword, the process continues at step 995, where the threshold $T_B$ is adjusted by $t_B$. For process 300 (FIG. 1), the $T_B$ is decreased by $t_B$. For a detector that implements any of processes 400 (FIG. 4), 500 (FIG. 5), or 600 (FIG. 6), $T_B$ is increased at step 995. The process returns to step 950 to erase the additional blocks that fail the constraint on $T_B$.

Returning to step 970, in response to determining that decoding at step 960 returned a codeword, the codeword is stored in a set of candidate codewords for the decoded data at step 975. The process continues at step 980. At step 980, a determination is made whether $T_B$ is greater than $T_G$ (less than if using process 300 of FIG. 3). If $T_B$ fails to meet the global threshold constraint $T_G$, the process returns to step 995 for adjustment to $T_B$ and further corrective decoding. Otherwise, the process continues at step 985 where the most likely codeword is selected from the set of candidate codewords and returned as the decoded output at step 990. Process 900 may be performed by hardware of firmware. It is understood that process 900 is merely illustrative, and that some steps may be omitted, reversed, or performed simultaneously without departing from the principles of the invention.

Although not explicitly shown, it will be apparent that the process 900 may be applied to the ranking method described in FIG. 7 as well. That is, one may select blocks whose LLRs are to be erased based on the block's reliability relative to other blocks. The global threshold constraint may be tested against the reliability metric of the most reliable block in the set of blocks selected, and the process terminated when the global constraint is met.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for detecting a defect in a decoded data block having a plurality of bits, said method comprising:
in response to determining that a first decoding phase of said decoded data block failed, determining a degree ($d_j$) of unsatisfied parity checks for each bit ($v_j$) of said plurality of bits to obtain a plurality of degrees of unsatisfied checks;
calculating a block reliability metric for said decoded data block based on a sum of said plurality of degrees of unsatisfied checks; and
detecting a defect in said decoded data block based on a comparison between said block reliability metric and a threshold.

2. The method of claim 1, wherein said detecting comprises detecting a defect in said decoded data block if said block reliability metric is greater than said threshold.

3. The method of claim 1, further comprising:
in a subsequent phase of iterative decoding in an error recovery mode, erasing a plurality of bit reliability metrics associated with said decoded data block if said decoded data block is defective.

4. The method of claim 1, wherein said block reliability metric is an average degree of unsatisfied checks per bit in said decoded data block.

5. A method for detecting a defect in a decoded data block having a plurality of bits, said method comprising:
in response to determining that a first decoding phase of said decoded data block failed, iteratively decoding said decoded data block in an error recovery mode;
receiving N signed bit reliability metrics for each bit ($v_j$) of said plurality of bits, where N corresponds to a number of iterations in said iterative decoding;
determining a plurality of first sums $s_j$, wherein each sum $s_j$ is a sum of said N signed bit reliability metrics for each bit ($v_j$) of said plurality of bits;
calculating a block reliability metric for said decoded data block based on a second sum $s_w$, where $s_w$ is a sum of said plurality of first sums $s_j$; and
detecting a defect in said decoded data block based on a comparison between said block reliability metric and a threshold.

6. The method of claim 5 wherein said detecting comprises detecting a defect in said decoded data block if said block reliability metric is less than said threshold.

7. The method of claim 5 wherein each said signed bit reliability metric for each said bit comprises a priori log-likelihood ratio from a channel iteration of said iterative decoding and an extrinsic log-likelihood ratio from a soft decoder iteration of said iterative decoding.

8. The method of claim 7 wherein said soft decoder iteration is performed by a low-density parity check (LDPC) code decoder.

9. An apparatus for detecting a defect in a decoded data block having a plurality of bits, said apparatus comprising:
circuitry that determines a degree ($d_j$) of unsatisfied parity checks for each bit ($v_j$) of said plurality of bits to obtain a plurality of degrees of unsatisfied checks if a first decoding phase of said decoded data block fails; and
a detector that:
calculates a block reliability metric for said decoded data block based on a sum of said plurality of degrees of unsatisfied checks, and
detects a defect in said decoded data block based on a comparison between said block reliability metric and a threshold.

10. The apparatus of claim 9, wherein said detector detects a defect in said decoded data block if said block reliability metric is greater than said threshold.

11. The apparatus of claim 9 further comprising:
an iterative decoder that in a subsequent phase of iterative decoding in an error recovery mode, erases a plurality of bit reliability metrics associated with said decoded data block if said data block is defective.

12. The apparatus of claim 9, wherein said block reliability metric is an average degree of unsatisfied checks per bit in said decoded data block.

13. An apparatus for detecting a defect in a decoded data block having a plurality of bits, said apparatus comprising:
an iterative decoder that iteratively decodes said data block in an error recovery mode if a first decoding phase of said decoded data block fails; and
a detector that:
receives N signed bit reliability metrics for each bit ($v_j$) of said plurality of bits, where N corresponds to a number of iterations performed by said iterative decoder,
determines a plurality of first sums $s_j$, wherein each sum $s_j$ is a sum of said N signed bit reliability metrics for each bit ($v_j$) of said plurality of bits,
calculates a block reliability metric for said decoded data block based on a second sum $s_w$, where $s_w$ is a sum of said plurality of first sums $s_j$, and
detects a defect in said decoded data block based on a comparison between said block reliability metric and a threshold.

14. The apparatus of claim 13 wherein said detector detects a defect in said decoded data block if said block reliability metric is less than said threshold.

15. The apparatus of claim 13 wherein
said iterative decoder comprises a channel detector and a soft decoder, and
each said signed bit reliability metric for each said bit comprises a priori log-likelihood ratio from a channel iteration of said channel detector and an extrinsic log-likelihood ratio from a soft decoding iteration of said soft decoder.

16. The method of claim 5 further comprising selecting, for each bit ($v_j$), a subset of the received N signed bit reliability metrics based on a sign of each received N signed bit reliability metric, wherein the first sum ($s_j$) is a sum of the subset of the received N signed bit reliability metrics.

* * * * *